United States Patent
Chang et al.

(10) Patent No.: US 9,954,063 B2
(45) Date of Patent: *Apr. 24, 2018

(54) STACKED PLANAR DOUBLE-GATE LAMELLAR FIELD-EFFECT TRANSISTOR

(71) Applicant: International Business Machines Corporation, Armonk, NY (US)

(72) Inventors: Josephine B. Chang, Bedford Hills, NY (US); Michael A. Guillorn, Cold Springs, NY (US); Gen P. Lauer, Yorktown Heights, NY (US); Isaac Lauer, Yorktown Heights, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/134,190

(22) Filed: Apr. 20, 2016

(65) Prior Publication Data
US 2016/0233320 A1    Aug. 11, 2016

Related U.S. Application Data

(63) Continuation of application No. 14/505,849, filed on Oct. 3, 2014, now Pat. No. 9,391,163.

(51) Int. Cl.
*H01L 27/12* (2006.01)
*H01L 29/10* (2006.01)
(Continued)

(52) U.S. Cl.
CPC ...... *H01L 29/1037* (2013.01); *H01L 21/0217* (2013.01); *H01L 21/02532* (2013.01);
(Continued)

(58) Field of Classification Search
None
See application file for complete search history.

(56) References Cited

U.S. PATENT DOCUMENTS 6,759,710 B2   7/2004   Chan et al.
7,229,901 B2   6/2007   Savage et al.
(Continued)

OTHER PUBLICATIONS

Monfray et al., "A solution for an ideal Planar Multi-Gates Process for ultimate CMOS?", 2010 IEEE International Electron Devices Meeting, Dec. 2010, pp. 11.2.1-11.2.4, © 2010 IEEE. DOI: 10.1109/IEDM.2010.5703339.

(Continued)

*Primary Examiner* — Shaun Campbell
(74) *Attorney, Agent, or Firm* — Nathan M. Rau (57) ABSTRACT

A method of making a field-effect transistor device includes providing a substrate with a fin stack having: a first sacrificial material layer on the substrate, a first semiconductive material layer on the first sacrificial material layer, and a second sacrificial material layer on the first semiconductive material layer. The method includes inserting a dummy gate having a second thickness, a dummy void, and an outer end that is coplanar to the second face. The method includes inserting a first spacer having a first thickness and a first void, and having an outer end that is coplanar to the first face. The method includes etching the first sacrificial material layer in the second plane and the second sacrificial material layer in the fourth plane. The method includes removing, at least partially, the first spacer. The method also includes inserting a second spacer having the first thickness.

18 Claims, 5 Drawing Sheets

(51) Int. Cl.

| | | |
|---|---|---|
| *H01L 29/66* | (2006.01) | |
| *H01L 29/78* | (2006.01) | |
| *H01L 29/423* | (2006.01) | |
| *H01L 29/06* | (2006.01) | |
| *H01L 21/02* | (2006.01) | |
| *H01L 21/321* | (2006.01) | |
| *H01L 21/3213* | (2006.01) | |
| *H01L 21/3065* | (2006.01) | |
| *H01L 29/04* | (2006.01) | |
| *H01L 29/40* | (2006.01) | |
| *H01L 29/786* | (2006.01) | |
| *H01L 21/306* | (2006.01) | |

(52) U.S. Cl.
CPC .... *H01L 21/3065* (2013.01); *H01L 21/32115* (2013.01); *H01L 21/32134* (2013.01); *H01L 29/045* (2013.01); *H01L 29/0649* (2013.01); *H01L 29/0692* (2013.01); *H01L 29/401* (2013.01); *H01L 29/42356* (2013.01); *H01L 29/42392* (2013.01); *H01L 29/6653* (2013.01); *H01L 29/6656* (2013.01); *H01L 29/66545* (2013.01); *H01L 29/66553* (2013.01); *H01L 29/66795* (2013.01); *H01L 29/785* (2013.01); *H01L 29/78696* (2013.01); *H01L 21/30604* (2013.01); *H01L 2029/7858* (2013.01)

(56) References Cited

U.S. PATENT DOCUMENTS

| | | | |
|---|---|---|---|
| 7,670,912 B2 | 3/2010 | Yeo et al. | |
| 7,696,046 B2 | 4/2010 | Kim et al. | |
| 7,800,172 B2 | 9/2010 | Lee et al. | |
| 7,923,315 B2 | 4/2011 | Pouydebasque et al. | |
| 7,973,336 B2 | 7/2011 | Savage et al. | |
| 7,977,187 B2 | 7/2011 | Bernard et al. | |
| 8,039,332 B2 | 10/2011 | Bernard et al. | |
| 8,293,608 B2 | 10/2012 | Orlowski et al. | |
| 8,541,774 B2 | 9/2013 | Bangsaruntip et al. | |
| 8,551,833 B2 | 10/2013 | Chang et al. | |
| 2004/0262690 A1 | 12/2004 | Coronel et al. | |
| 2008/0099849 A1* | 5/2008 | Kim | H01L 29/42392 257/365 |
| 2011/0014769 A1 | 1/2011 | Pouydebasque et al. | |
| 2011/0121391 A1 | 5/2011 | Monfray et al. | |
| 2012/0292715 A1 | 11/2012 | Hong et al. | |
| 2014/0001520 A1* | 1/2014 | Glass | H01L 29/66439 257/288 |
| 2014/0099793 A1 | 4/2014 | Sun et al. | |
| 2014/0264592 A1* | 9/2014 | Oxland | H01L 29/66795 257/347 |
| 2014/0293295 A1 | 10/2014 | Kuwabara | |
| 2015/0171083 A1 | 6/2015 | Wang et al. | |
| 2016/0099338 A1 | 4/2016 | Chang et al. | |

OTHER PUBLICATIONS

Chang et al., "Stacked Planar Double-Gate Lamellar Field-Effect Transistor," U.S. Appl. No. 15/134,155, filed Apr. 20, 2016.
Chang et al., "Stacked Planar Double-Gate Lamellar Field-Effect Transistor," U.S. Appl. No. 15/134,174, filed Apr. 20, 2016.
List of IBM Patents or Patent Applications Treated as Related, signed Apr. 18, 2016, 2 pages.

* cited by examiner

STACKED PLANAR DOUBLE-GATE LAMELLAR FIELD-EFFECT TRANSISTOR

BACKGROUND

The present disclosure relates to field-effect transistor devices and more particularly, to techniques for fabricating a stacked planar field-effect transistor device.

In its basic form, a field-effect transistor ("FET") includes a source region, a drain region and a channel between the source and drain regions. A gate regulates electron flow through the channel between the source and drain regions.

Gate all-around or double gate lamellar FETs may enable density scaling beyond current planar complementary metal-oxide-semiconductor ("CMOS") or fin FET ("FinFET") technology. There are, however, notable challenges related to fabrication and structure of gate all-around or double gate lamellar FETs.

SUMMARY

Embodiments of the present disclosure provide for a field-effect transistor device and method of making a field-effect transistor device.

One embodiment is directed toward a method of making a field-effect transistor device. The method includes providing a substrate with a fin stack having: a first sacrificial material layer on the substrate, a first semiconductive material layer on the first sacrificial material layer, and a second sacrificial material layer on the first semiconductive material layer. The method includes inserting a dummy gate having a second thickness, a dummy void, and an outer end that is coplanar to the second face. The method includes inserting a first spacer having a first thickness and a first void, and having an outer end that is coplanar to the first face. The method includes etching the first sacrificial material layer in the second plane and the second sacrificial material layer in the fourth plane. The method includes removing, at least partially, the first spacer. The method also includes inserting a second spacer having the first thickness, and a second void onto the first face so that the second spacer exposes and surrounds the semiconductive layer.

Another embodiment is directed toward a semiconductor device. The device includes a semiconductor substrate. The device includes a field effect transistor (FET) separated from the semiconductor substrate by an insulator. The FET includes a first source/drain region and a second source/drain region having a first dopant type. The FET includes a plurality of lamellar channels parallel to the substrate having a first end and a second end, the first end and second end are electrically coupled to respective first source/drain region and second source/drain region, and the plurality of lamellar channels have a length between the first source/drain region and second source/drain region, wherein each lamellar channel is between 5 nm and 10 microns wide. The device includes an all-around gate surrounding at least a portion of the length of the plurality of lamellar channels, the gate having a gate dielectric around the lamellar channel and a gate metal around the gate dielectric, the lamellar channels surrounded by the gate having a second dopant type. The device includes a first insulating spacer between the first source/drain region and the gate metal. The device also includes a second insulating spacer between the second source/drain region and the gate metal, wherein the first insulating spacer and the second insulating spacer surround a portion of the length of the plurality of lamellar channels at the respective first ends and second ends, wherein the first insulating spacer and the second insulating spacer are configured to limit the capacitance between the gate metal and the respective first source/drain region and second source/drain region.

Improved techniques for fabrication and improved structure for gate all-around or double gate lamellar FETs may be desirable.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While the embodiments are amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DETAILED DESCRIPTION

Aspects of the present disclosure relate to techniques for fabricating (and related structures of) field-effect transistors ("FETs"). More particular aspects relate to techniques for fabricating (and related structures of) double gate lamellar FETs using one or more internal dielectric spacers. Double gate lamellar FETs may be fabricated through a multi-operation process flow.

Generally, FETs come in various forms, one of which is the metal-oxide-semiconductor FET ("MOSFET"). While prevalent in today's microchips and logic devices, MOSFETs have various shortcomings. Some of these shortcomings come into greater focus as the size of the die used for manufacturing the MOSFETs becomes smaller and smaller, measured in tens of nanometers or less in some cases. For simplicity, FET may be used herein to denote various FETs, including MOSFETs, according to various embodiments.

Traditionally, FETs have often been configured in a horizontal, planar layout. However, as FETs have become smaller, various issues such as parasitic capacitance and short-channel effects, among others, have become greater hindrances and have tended to impair the progress of FETs' performance in the planar layout. To combat these various issues, new layouts and structures have been developed, such as the FinFET. In a general sense, FinFETs use rows of vertically-oriented FETs, which may be described as "fin-like," in order to create greater physical separation between various FETs within a single device. However, FinFETs also have various drawbacks, such as various issues related to parasitic capacitance and limitations on manufacturing, spacing, or overall FET density, among others. The term "Tri-gate" can be substituted for the term "FinFET" in this disclosure, according to various embodiments.

Various problems may currently exist for FinFETs as they currently exist. FinFET electrostatics are controlled by the width of the associated fin ("D-fin"), which therefore must be well controlled. Since D-fin variation must be well controlled, this dimension is typically created by transferring a sidewall created from forming a spacer on a mandrel so that the common drain ("CD") is more closely determined from a deposited film thickness rather than a lithography-defined dimension. However, due to issues in pattern transfer, there are still both systematic and random variation in CD, such as the end-fins of an array being larger than those inside the array. These larger end-fins must be removed, which wastes area.

Another problem that currently exists in FinFETs is that the FinFETs must be tall in order to provide current density per layout footprint similar to planar devices. In fact, to make up for additional parasitics that the fins have, it is typical to further increase the fin height such that the current density is higher than planar. Creating tall, skinny fins presents many challenges, e.g., spacer formation.

Another limitation of current FinFET design relates to spacing. FinFETs must be placed close together to support the current density requirements listed herein. This creates a high aspect ratio trench between the fins, which complicates (in replacement gate) dummy gate patterning and spacer formation, as well as final gate metallization.

Gate all-around nanowire face similar challenges to FinFETs in terms of drain wire ("D-wire") control and achieving high current density per layout footprint.

A possible solution to the above listed problems exists, using impractical fabrication techniques, such as hydrogen silsesquioxane (HSQ) and dummy/suspension gates. The resulting structure has significantly worse than acceptable parasitics.

While technically gate all-around, the thin and wide nature of the channel as described herein may be more appropriately described as double gate. The stacking dramatically increases current density per layout footprint. Also, the channel thickness that dictates electrostatics is set by a deposited thickness, rather than one created from pattern transfer. Also, the aspect ratio presented to processes such as dummy-gate and spacer reactive ion etching ("RIE") may be much more relaxed than for a FinFET. Compared to prior art, this disclosure describes a structure and making thereof with reduced parasitics, and while using more conventional fabrication techniques.

Utilizing a multi-layered, three-dimensional FET layout may allow for mitigation of various drawbacks compared to other FET designs. Likewise, efficiency, performance, or FET density may be improved. One example of a three-dimensional FET layout is a lamellar (i.e., stacked planar) double gate FET device, which will be further described in this disclosure. The descriptor "lamellar" may generally denote a thin plate, scale, or layer. Lamellar may therefore be useful and appropriate to describe the structure or structures described herein, according to various embodiments.

Various comparisons may be made between FinFETs and lamellar FETs as described herein:
1. FinFETs may generally use sidewall image transfer ("SIT") patterning. Lamellar FETs may instead use traditional patterning processes, including direct patterning.
2. FinFETs may generally include a layout with integer widths, whereas a lamellar FET may have continuous layout, where channel widths may vary.
3. FinFETs may have junctions that are graded over the device width. Lamellar FETs may instead have junctions that are constant over the device width.
4. A FinFET may have 3D capacitance shared over a small width, whereas a lamellar FET may have 3D capacitance shared over a relatively large width.
5. A FinFET's spacer profile is generally critical, whereas the spacer profile on a lamellar FET is more relaxed, and the height of a slab can vary.
6. The aspect ratio of the fin of a FinFET is generally limited by reactive-ion etching processes ("RIE"), whereas the aspect ratio for lamellar FET is limited by release etch selectivity.
7. The RIE profile of a FinFET is generally critical, whereas it is more relaxed with lamellar FET.
8. D-fin control is through SIT and RIE for FinFET, but through epitaxy and release etch sensitivity for lamellar FET.
9. Channel orientation for FinFET is (110)/<110>, whereas the orientation is (100)/<110> for lamellar FET.
10. The fin pitch for FinFET is defined by the lithography and RIE limits. For lamellar FET, it is limited by epitaxy.
11. The fin height/fin pitch ("fin effect") is less than 2 for FinFET, but can be 2, 4, 6, and up for lamellar FET.
12. III-V materials are a question for patterning in FinFET, but they may be acceptable for lamellar FET.

Various methods may be utilized to make a semiconductor device having a lamellar stacked planar FET. For example, a fin stack, including layers of semiconductive material and layers of sacrificial material, may be added to a provided substrate (also known as a wafer). The fin stack may have three pairs of sides, each pair being parallel to each other, with each pair of sides being perpendicular to the other two pairs of sides. The first pair including a top side and a bottom side, the second pair including a front side and a back side and a third pair including two lateral sides. The two lateral sides constitute the last two sides of the fin stack, making a total of six sides, The front and back sides of the fin stack may correspond to the front and back sides of the semiconductor device, respectively. A first spacer and a dummy gate, separated by a deposited oxide layer, may be placed on the fin stack. The sacrificial and semiconductive layers of the fin stack may then be planarized on a front side at a first face, and the sacrificial layers selectively partially removed (e.g., by etching) on the same side, leaving protruding fins of semiconductive material separated by trenches. The protruding fins of semiconductive material layers may be denoted as lamellar channels. The first spacer and the oxide layer may then be removed and replaced with a second spacer and oxide layer. The second spacer may cover the etched sacrificial material layers of the fin stack, but the second spacer may leave the ends of the lamellar channels exposed. On the exposed end of the lamellar channels at the back side may be formed a first source/drain region. Any gaps surrounding the source/drain region may then be filled with a gap-fill dielectric, which may then be planarized. The dummy gate may then be removed and the sacrificial material layers may be selectively partially removed on the dummy gate side of the device. A high-k dielectric may then be applied to the protruding semiconductive material layers as the remaining areas, including the partially removed sacrificial layers and the second spacer. A replacement metal gate process may then surround the lamellar channels on the dummy gate side of the device, creating a lamellar gate all-around FET.

High-k dielectric may be defined as a dielectric with a dielectric constant (k) value higher than $SiO_2$. More specifically, a high-k dielectric may have a k higher than 3.9. Various examples of high-k include, but are not limited to, hafnium dioxide ($HfO_2$), zirconium dioxide ($ZrO_2$) and titanium dioxide ($TiO_2$) hafnium silicate ($HfSiO_4$), or zirconium silicate ($ZrSiO_4$). As used herein, dielectric may refer to high-k or non-high-k dielectric materials.

While the present disclosure is not necessarily limited to such applications, various aspects of the disclosure may be appreciated through a discussion of various examples using this context.

FIGS. 1A-1D illustrate isometric representations of operations in a process flow for a method of making a FET, according to various embodiments.

Figure 1A:
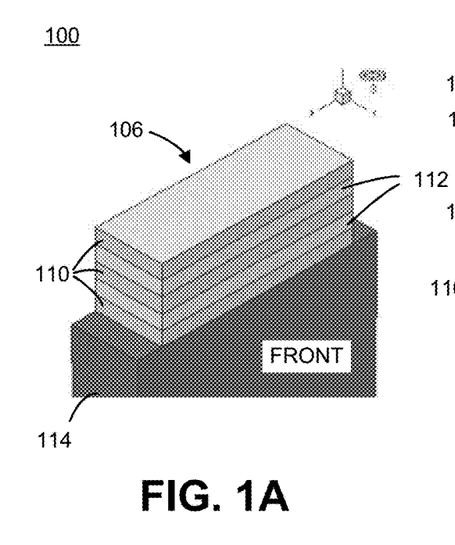
FIGS. 1A-1D illustrate isometric representations of operations in a process flow for a method of making a field-effect transistor ("FET"), according to various embodiments.

FIG. 1A illustrates a front isometric representation of a first operation in a process flow for a method of making a FET 100, according to various embodiments. FIG. 1A may correspond to operations 508, 510 and 514 of method 500 in FIG. 5.

A substrate 114 may be given. The substrate 114 may be made of silicon (Si), according to various embodiments. Formed on the substrate 114 may be a fin stack 106 of alternating sacrificial layers 110 and semiconductive layers 112. Semiconductive layers 112 may also be lamellar channels. The fin stack may be formed by first creating a first sacrificial layer 110. On the first sacrificial layer may be deposited a first semiconductive layer 112. The first semiconductive layer 112 may be between about 8 nanometers ("nm") thick (top to bottom) and 250 nm wide (measured from lateral side to side) with the third dimension measurement being the channel length and variable according to various embodiments. According to one embodiment, the channel length may be less than about 100 nm. The first semiconductor layer 112 may be between 3 nm and 15 nm tall, according to various embodiments. A second sacrificial layer 110 may be deposited on the first semiconductive layer 112. The process of adding alternating semiconductive layers 112 and sacrificial layers 110 may repeat until the fin stack 106 has a desired number of layers formed on the substrate 114. The final layer added (which may be the top layer in the fin stack 106) may be a sacrificial layer 110, according to various embodiments.

Figure 1B:
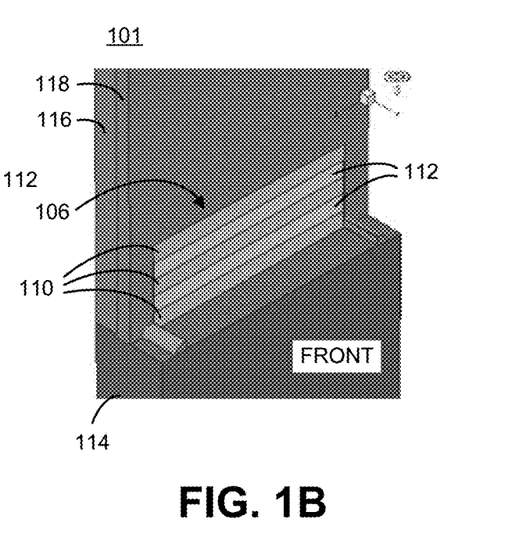

FIG. 1B illustrates a front isometric representation of a second operation in a process flow for a method of making a semiconductor device 101, according to various embodiments. FIG. 1B may correspond to operations 514 and 512 of method 500 in FIG. 5.

A dummy gate 116 may be formed and inserted. The dummy gate 116 may be formed and inserted on and around the top (i.e., last added) layer of the fin stack 106, and may touch the substrate 114 around the bottom ends of the fin stack 106.

The dummy gate 116 material (e.g., poly-silicon) may be deposited on the fin stack 106 using low pressure chemical vapor deposition ("LPCVD"), according to various embodiments. The dummy gate 116 may then be patterned, e.g., by etching. The patterning of the dummy gate may align with the outline and location of the fin stack 106.

The dummy gate 116 may have a dummy void that may not contain dummy gate material, and which may occupy an area of the dummy gate equivalent to the coplanar area of the fin stack with respect to the first spacer. The dummy void may be of the same thickness as the dummy gate from front to back and therefore the dummy gate may be completely removed along the fin stack 106. The dummy void may be located on the lower end of the dummy gate 116, and may be adjacent to the substrate 114.

The first spacer 118 material may then be deposited onto the fin stack 106 and the dummy gate 116, and may have a first thickness or be planarized to the first thickness. The deposited first spacer 118 material may then be patterned into a first spacer 118. The first spacer 118 may be perpendicular to the first plane and parallel to the dummy gate 116, with the width of the spacer being in the lateral side to side direction, the direction of the lamellar channels of the individual layers of the fin stack 106.

The first spacer 118 may have a first void, which may have a shape or size equivalent to the coplanar area of the fin stack 106 with respect to the first spacer 118 (i.e., the parts of sacrificial layers 110 and semiconductive layers 112 visible in 100 of FIG. 1B). The first spacer 118 may have an outer end that may be coplanar to the first face. The first spacer 118 may be a fin hardmask, according to various embodiments.

The patterning of the first spacer 118 may be commensurate with an outline and location of the semiconductive layers (which may form lamellar channels in another operation). The semiconductive layers may be used for deposition and formation of the source/drain region, and may form channel regions of the device, as described herein.

Prior to depositing a dummy gate 116 on the first spacer 118, an oxide layer (not shown) may be formed on the exposed surfaces of the first spacer 118 and fin stack 106 (oxidation step). The oxide layer may be formed on the fins using thermal oxidation. During this oxidation step, more of the sacrificial layer 110 material may be consumed than the semiconductive layer 112 material due to different structural and chemical properties, (e.g., Ge may be more reactive than pure Si) thus resulting in laterally thinner sacrificial layers 110 than semiconductive layers 112. The oxide layer may be formed to provide an etch stop layer for the dummy gate 116 removal process. For example, if poly-silicon is used as the dummy gate 116 material, an oxide layer may be needed to protect the semiconductive layers 112 during the poly-silicon removal operation since there may be essentially no etch contrast between poly-silicon and various semiconductive materials, according to various embodiments. In an embodiment where a dummy gate oxide layer is deposited rather than grown, an undercut of one or more sacrificial layers may not be necessary.

The first spacer 118 may be formed from a dielectric material, such as from a nitride material. An example of a nitride material that may be used as a dielectric includes, but is not limited to, silicon nitride (SiN). Alternatively, the first spacer may be made of other dielectric materials, such as silicon dioxide ($SiO_2$). Insertion of the first spacer 118 may begin with a spacer material (e.g., SiN, $SiO_2$) being deposited onto the fin stack 106 using, for example, chemical vapor deposition ("CVD"), plasma enhanced CVD ("PECVD") or any suitable technique for dielectric deposition that does not induce a physical or chemical change to the fin stack 106 layers.

The fin stack 106 may then be planarized at a first face, the fin stack 106 being planarized so that its edge at the first face is coplanar to the edge of the first spacer 118 along the first face. The substrate 114 may not be planarized with the fin stack 106, as is further described in another operation.

Figure 1C:
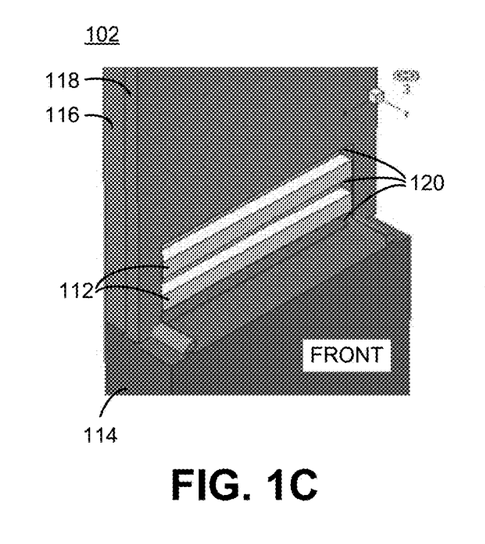

FIG. 1C illustrates a front isometric representation of a third operation in a process flow for a method of making a FET 102, according to various embodiments. FIG. 1C may correspond to operations 518 and 520 of method 500 in FIG. 5.

As described herein, the semiconductor layers 112 may form lamellar channels (the protruding portion of the semiconductive layers 112 shown) in the device and the fin stack 106. In order to be able to form a gate (a replacement gate, not shown) that surrounds the lamellar channels, the sacrificial layers 110 may be partially removed (e.g., by selective etching of SiGe vs. Si, or by selective oxidation of SiGe vs. Si followed by a wet etch of the resulting oxide from at least the Si) from the fin stack 106 down to the dummy gate 116, resulting in a stack of lamellar channel layers formed from the semiconductive layers 112. As provided herein, a greater number of semiconductive layers 112 or sacrificial layers 110 than what are shown in the figures may be implemented in a similar manner as described herein, except that in the initial stages of the process, additional semiconductive layers 112 or sacrificial layers 110 may be formed in the fin stack 106. Additional layers may be formed parallel to the first plane.

As described herein, the sacrificial layers 110 (FIG. 1B) may be partially removed from the fin stack 106 by various means, e.g., by etching. After removal, trenches 120 may be formed. A chemical etchant may be employed to exploit the lower oxidation potential of the sacrificial layers 110 as compared to the semiconductive layers 112. Examples of such etchants include, but are not limited to a 1:2:3 mixture of HF:hydrogen peroxide ($H_2O_2$):acetic acid ($CH_3COOH$), or a mixture of sulfuric acid ($H_2SO_4$) and $H_2O_2$. Alternatively, the sacrificial layers 110 may be selectively removed using a dry etching process such as oxygen ($O_2$) plasma etching or plasma chemistries typically used for etching.

When the sacrificial layers have been partially removed, semiconductive layers 112 may form lamellar channels by the exposed semiconductive layers on the front side. The lamellar channels may be used for deposition and formation of the source/drain region, as described herein.

According to various embodiments, a Si-selective reactive-ion etching ("RIE") may be used to remove portions of the semiconductive 112 or sacrificial layers 110 not masked by the first spacer 118. The etching process may be end-pointed when the etch proceeds to the substrate 114. Accordingly, etching the substrate 114 more than necessary to etch various fin stack 106 layers may not be advantageous.

The orientation of the sacrificial material layer partial removal or fin etch may be parallel to the various fin stack 106 layers. The first spacer 118 may be configured to have a pitch of a set spatial frequency. To maximize layout density and minimize parasitic capacitance, the pitch may be made as small as possible within patterning and processing limits. To achieve pitches smaller than what can be defined by direct lithography, a pitch doubling technique such as sidewall image transfer ("SIT") or double patterning/double etching may be used. The thickness (i.e., pitch/width) of the first spacer 118 may determine the thickness (i.e., pitch/width) of the associated lamellar channels. Therefore if a desired lamellar channel thickness is known prior to the formation of the first spacer 118, the first spacer may be made such that the desired lamellar channel thickness is the first thickness of the first spacer 118.

The etching or partial removal of the sacrificial layers 110 from the fin stack 206 may proceed as follows. For example, a chemical etchant may be employed that takes advantage of the lower oxidation potential of the sacrificial layers 110 as compared to the semiconductive layers 112. Examples of such etchants include, but are not limited to a 1:2:3 mixture of HF:hydrogen peroxide ($H_2O_2$):acetic acid ($CH_3COOH$), or a mixture of sulfuric acid ($H_2SO_4$) and $H_2O_2$, according to various embodiments. Alternatively, the sacrificial layers 110 may be selectively removed using a dry etching process such as oxygen ($O_2$) plasma etching or plasma chemistries typically used for etching.

As the first spacer 118 is formed prior to the lamellar channel formation, once the sacrificial layers 110 are removed (e.g., by etching) from the semiconductive layers 112, a gap may be left in the first spacer 118 under the formed lamellar channels. If the gap were to be left open (i.e., not filled with dielectric), then the replacement gate material could fill the gap at another operation. This additional amount of gate material would possibly increase the harmful parasitic capacitance of the gate to the source/drain region. The gap left in the first spacer 118 may be filled at another operation with a second spacer.

Since the fin etch may be performed before the dummy gate/replacement gate operations (See FIGS. 2A-2B, 3A-3D), this process may be referred to as a fin first process.

Figure 1D:
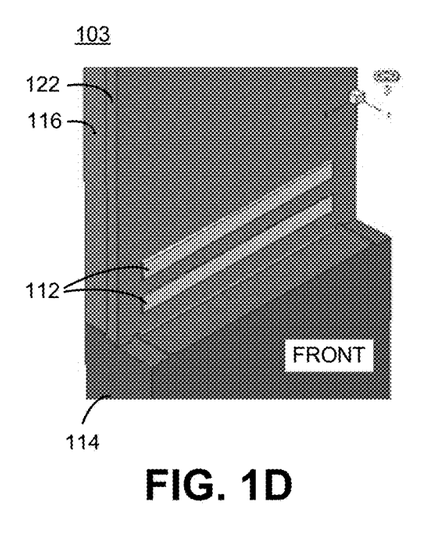

FIG. 1D illustrates a front isometric representation of a fourth operation in a process flow for a method of making a FET 103, according to various embodiments. FIG. 1D may correspond to operation 522 of method 500 in FIG. 5.

A second spacer 122 may be inserted in a similar way as the first spacer 118 was inserted, as described herein. The second spacer 122 may be inserted in the location vacated by the removal of the first spacer 118. The second spacer 122 may be of the same (first) thickness of the first spacer 118. The second spacer 122 may have a second void onto the first face so that the second spacer 122 exposes the semiconductive layers 112. The second void of the second spacer 122 may have an area similar to the area of the first void of the first spacer 118, except that the trenches formed from the recessed sacrificial layers (120, FIG. 1C) may be covered by the second spacer, only exposing the semiconductive layers 112 (i.e., the lamellar channels) on the front side.

Figure 2A:
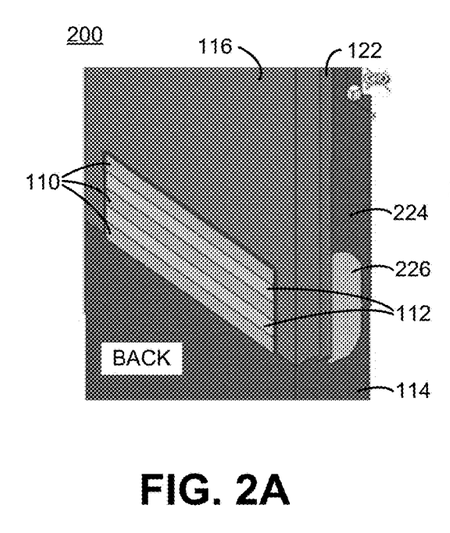
FIGS. 2A-2B illustrate isometric representations of operations in a process flow for a method of making a FET, according to various embodiments.
Figure 2B:
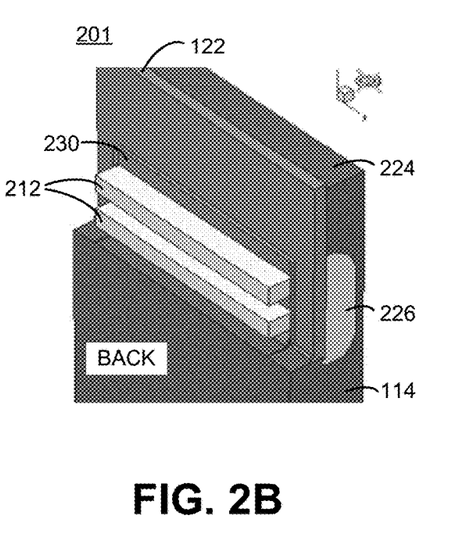

FIGS. 2A-2B illustrate isometric representations of operations in a process flow for a method of making a FET device, according to various embodiments.

FIG. 2A illustrates a back isometric representation of a fifth operation in a process flow for a method of making a FET 200, according to various embodiments. FIG. 2A may correspond to operation 524 of method 500 in FIG. 5.

Epitaxy may be used to form a source/drain region 226 on the exposed portions of the fin stack 106, including lamellar channels formed from the semiconductive layers 112. The source/drain region 226 may also be formed on the second spacer 122. The source/drain region 226 may be electrically coupled to the semiconductive layers 112 on the first face and touching the second spacer 122. The source/drain region 226 may be a raised source/drain region, according to various embodiments. To form the source/drain region 226 an epitaxial process may be carried out using vapor-phase epitaxy ("VPE"), molecular-beam epitaxy ("MBE") or liquid-phase epitaxy ("LPE") with a gaseous or liquid precursor, such as silicon tetrachloride. The source/drain region 226 may then doped in order to distinguish the source/drain region 226 from the lamellar channels of the semiconductive layers 112. Doping may also occur during the epitaxial process, according to various embodiments. Example source/drain dopants may include, but are not limited to, alone or in various combinations, boron, arsenic, and phosphorous.

Further parameters and processes for using epitaxy to form the source/drain region 226 are known to those of skill in the art and accordingly need not be described further herein. Another source/drain region may be formed (not shown) on the back side of the device, in order to complete a functional FET device having both source and drain regions.

The various techniques described herein may make use of a damascene gate process to construct the source/drain region 226. The source/drain region 226 may be self-aligned with the gate (not shown), according to various embodiments.

A gap-fill 224 material may then be deposited onto the device formed by the second spacer 122, the source/drain region 226 and the substrate 114, filling the spaces between the second spacer 122 and the end of the device at the first plane. Gap-fill material 224 may include any suitable filler material, including a dielectric material, such as silicon dioxide ($SiO_2$). The gap-fill material 224 may be deposited using a high-density plasma ("HDP"), according to various embodiments. Chemical-mechanical planarization ("CMP") may then be used to planarize the gap-fill material 224, using the second spacer 122 as an inner etch stop, and the first face as the outer plane.

Prior to forming the source/drain region 226, the semiconductive layers 112 electrically coupled to the source/drain region 226 may be doped using, for example, in-situ doping with a suitable source/drain dopant. Example source/drain dopants may include, but are not limited to, alone or in various combinations, boron, arsenic, and phosphorous. Carbon or fluorine may be added as impurities to control diffusion of various dopant species, according to various embodiments.

FIG. 2B illustrates a back isometric representation of a sixth operation in a process flow for a method of making a FET 201, according to various embodiments. FIG. 2B may correspond to operation 528 of method 500 in FIG. 5.

The dummy gate 116 may then be removed from the device. The dummy gate 116 may be removed using an aqueous (wet) etch process, a chemical etching process, such as chemical downstream or potassium hydroxide (KOH) etching, or reactive-ion etching ("RIE"), according to various embodiments. The dummy gate 116, when removed, may expose an oxide layer at a third face. The oxide layer may then be removed, according to various embodiments. The third face may be parallel to and located between the first face and the second face, according to various embodiments.

Removal of the dummy gate 116 may result in various edges of the fin stack being exposed. The sacrificial layers (shown recessed) may be partially removed by a selective etch down to a depth of the third face at 230. After the selective etch, lamellar channels (formed from the semiconductive layers) 112 may be exposed, including trenches formed between the lamellar channels. A trench distinguishes a lamellar channel 226 region of the device from an eventual gate region of the device, according to various embodiments.

The sacrificial layers 110 may be etched to a depth of the second thickness. The first sacrificial layer 110 in the second plane and the second sacrificial layer 110 in the fourth plane may be etched to add a depth of the second thickness as measure from the second face to the third face, exposing the semiconductive layers 112 as gate channels 212 protruding by a second thickness.

A high-k (dielectric) layer may be deposited on the third face, according to various embodiments (not shown). The high-k layer may surround the exposed semiconductor material (lamellar channels) except for the semiconductive layers' 112 outer end at the second face, which may be coupled to a second source/drain region (not shown).

Figure 3A:
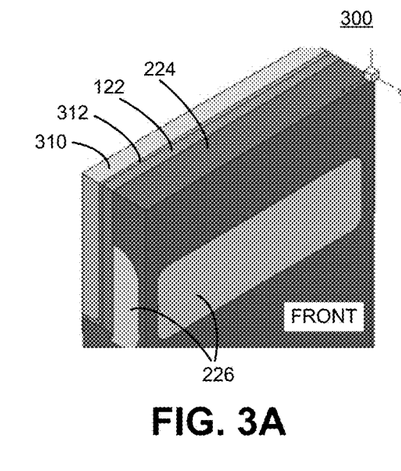
FIGS. 3A-3B illustrate isometric representations of views of a FET, according to various embodiments.
Figure 3B:
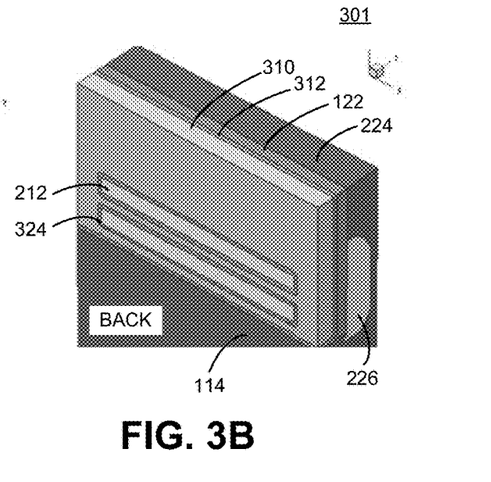

FIGS. 3A-3B illustrate isometric representations of views of a FET, according to various embodiments.

FIG. 3A illustrates a first isometric representation of a front view of a FET 300, according to various embodiments.

A replacement metal gate 310 may then be deposited on the high-k gate dielectric layer 312. The gate 310 may form a gate all-around (surrounding the gate channels 212, FIG. 3B). The gate 310 may include dielectric material deposited surrounding the lamellar channels (see also 324, FIG. 3B). The dielectric material 324 employed may be a high-k dielectric material, such as hafnium oxide, that is deposited using a conformal deposition process such as atomic layer deposition ("ALD"), according to various embodiments. A planar dielectric layer 312 may also be placed between the second spacer 122 and the replacement gate 310. High-k dielectrics may be well suited for a gate all-around process flow, due to a possible need for a small equivalent oxide thickness for performance and electrostatic control reasons and also a possible need for a relatively large physical thickness to fill gaps underneath the spacers.

Referring again to FIG. 3A, the replacement gate 310 may be a metal gate, according to various embodiments. Suitable gate materials may include, but are not limited to, one or more of poly-silicon, a deposited metal, (e.g., titanium nitride [TiN], tantalum nitride [TaN], or tungsten [W]), and a hybrid stack of multiple materials such as metal poly-silicon. The gate 310 may be planar and may be located between the second face and the third face. The gate 310 may be planarized at the second plane, according to various embodiments.

The gap-fill dielectric 224 and the source/drain region 226 are also represented from a different angle.

FIG. 3B illustrates a second isometric representation of a back view of a FET 301, according to various embodiments.

A reverse (back) angle view, as compared to FIG. 3A (similar to that of FIGS. 2A-2B) of the completed FET is shown. A replacement gate 310 may be formed in the trenches surrounding a gate dielectric 324, which may surround gate channels 212. The gate 310 may be formed by filling the trenches with a gate material. Once the gate material has filled into trenches, CMP may be used to planarize the gate material. Suitable gate materials may include, but are not limited to, one or more of poly-silicon, a deposited metal, (e.g., titanium nitride [TiN], tantalum nitride [TaN], or tungsten [W]), and a hybrid stack of multiple materials such as metal poly-silicon. Gate dielectric materials may include, but are not limited to, hafnium (Hf) or zirconium (Zr).

The gate dielectric 324 may be used to surround the gate channels 212. As provided herein, the gate dielectric may be a high-k dielectric deposited using a conformal process, such as ALD. The gap between the gate channels 212 and the gate dielectric 310 may be filled by the gate dielectric 324, and the gate material may not enter the gap. A gate dielectric (e.g., high-k) may be formed on exposed portions of the fins prior to deposition of the replacement gate material. The gate dielectric may be formed using a thermal oxidation process, according to various embodiments.

At various dimensions, a high-k dielectric may be employed because a small equivalent oxide thickness ("EOT") may be required for performance and electrostatic control reasons. However, various physical thicknesses to fill the gap may be necessary, according to various embodiments.

The replacement gate (310, FIG. 3B) may be formed in and around the trenches surrounding the gate channels 212. The replacement gate 310 may be formed after the gate dielectric 324 and planar dielectric layer 312 are deposited. First, the trenches may be filled with a gate material. Once the gate material is filled into trenches, CMP may be used to planarize the gate material. Suitable gate materials may include, but are not limited to, one or more of poly-silicon, a deposited metal (e.g., titanium nitride [TiN], tantalum nitride [TaN], or tungsten [W]) and a hybrid stack of multiple materials such as metal poly-silicon.

As described in detail herein, the replacement gate 310 may be formed surrounding gate channels (with high-k dielectric in between) of the device, in a gate all-around configuration. Functionally, a gate all-around configuration using thin, wide lamellar FETs may be functionally similar to a double gate configuration. Accordingly, the two terms may be used interchangeably throughout this disclosure.

Figure 3C:
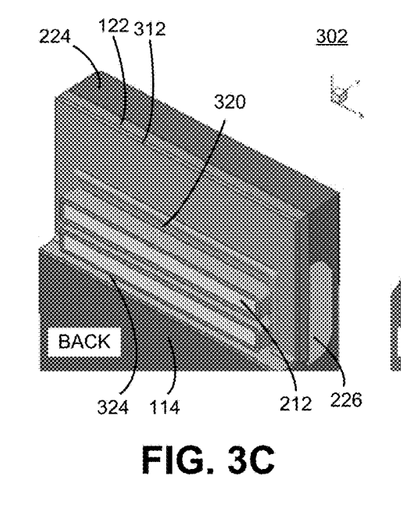
FIGS. 3C-3D illustrate isometric representations of cut-away views of a FET, according to various embodiments.
Figure 3D:
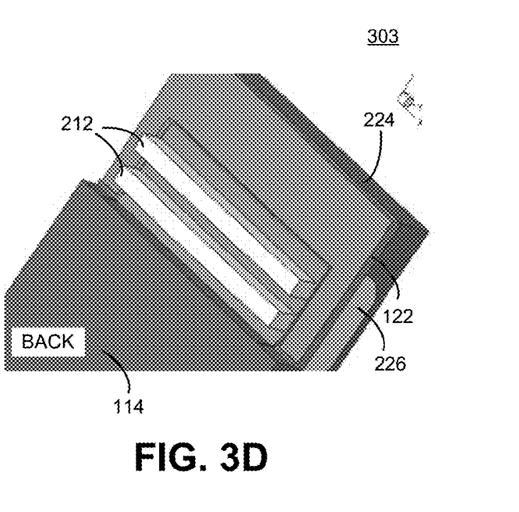

FIGS. 3C-3D illustrate isometric representations of cut-away views of a completed FET, with various components selectively removed for illustrative purposes, according to various embodiments.

FIG. 3C illustrates a third isometric representation of a cut-away back view of a FET 302, according to various embodiments.

Shown is a completed FET device structure after replacement gate formation, according to various embodiments. In this example, the replacement gate 310 has been selectively removed, for illustrative purposes. This example shows the gate channels 212 and how the gate channels 212 are surrounded by the gate dielectric layer 324 (a gate all-around or double gate).

Accordingly, the gate dielectric 324 may be used to fill the gap between the gate channels 212 and the gate material 310. The gate dielectric material employed, e.g., a high-k dielectric, may be deposited using a conformal process, such as ALD.

The planar dielectric layer 312 may fill the space left by the sacrificial layers of the fin stack, as depicted at 320. The sacrificial layers may be fully removed prior to or during the deposition of the planar dielectric layer 312, and may therefore no longer be exposed, according to various embodiments.

Also shown are the source/drain region 226, the gap-fill 224, the second spacer 122, the planar dielectric layer 312 and the substrate 114, as described herein.

FIG. 3D illustrates a fourth isometric representation of a cut-away back view of a FET 303, according to various embodiments.

As depicted here, the gate dielectric (FIG. 3C, 324; not shown) has been selectively removed from surrounding the gate channels 212 for illustrative purposes. The planar dielectric layer 312 can be seen exposed next to the protruding gate channels 212.

Also shown are source/drain region 226, gap-fill 224, the second spacer 122, and the substrate 114, as described herein.

Figure 4A:
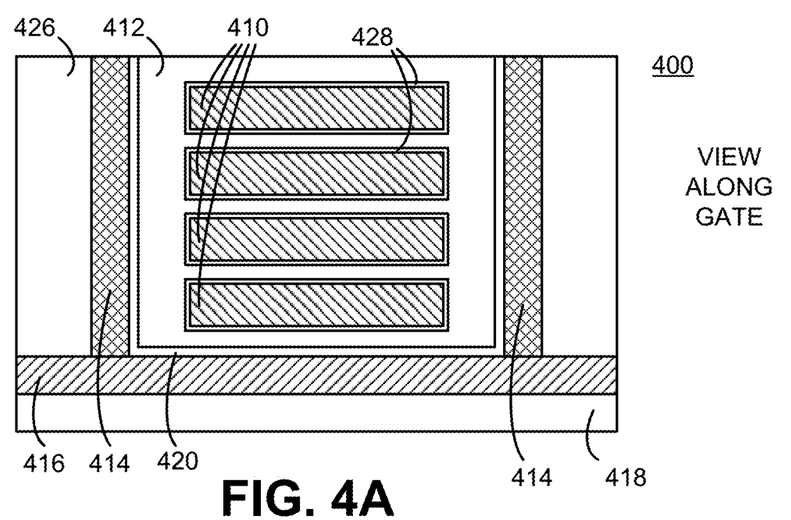
FIGS. 4A-4B illustrate two-dimensional representations of cross-sectional views of a FET, according to various embodiments.
Figure 4B:
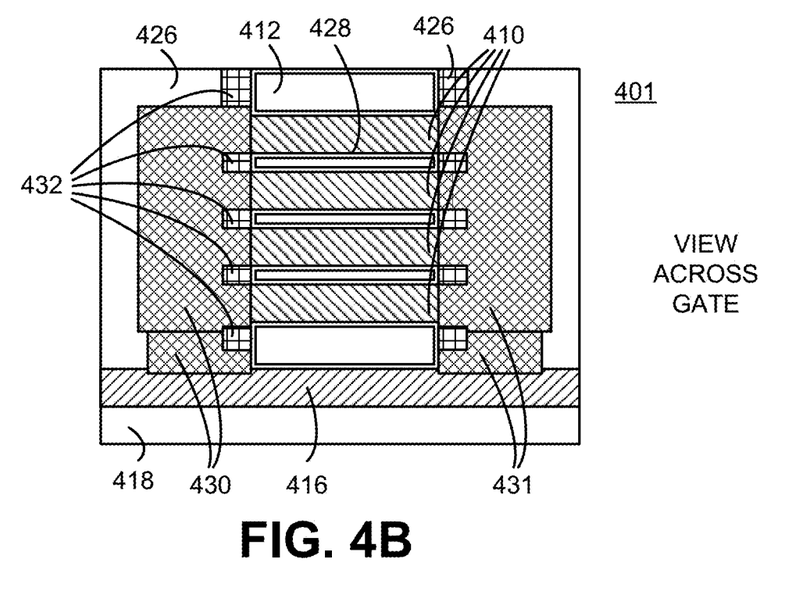

FIGS. 4A-4B illustrate two-dimensional cross-sectional views of a completed FET device, according to various embodiments. FIGS. 4A-4B illustrate an embodiment of the FET device having two source/drain regions located on opposite sides of the lamellar channels. FIG. 4B may represent two mirrored device representations of various other FIGs. described herein, according to various embodiments. An example of a functional FET having a source region and a drain region is thus represented in this FIG.

FIG. 4A illustrates a first two-dimensional representation of a cross-sectional view of a completed FET device 400, viewing a section along the gate, according to various embodiments.

FIG. 4B illustrates a second two-dimensional representation of a cross-sectional view of a completed FET device 401, viewing a section across the gate (i.e., rotated 90 degrees about a vertical axis as compared to FIG. 4A), according to various embodiments.

A substrate 418 may lie at the base of the FET device. The substrate 418 may lie below a buried oxide ("BOX") layer 416. The substrate may be silicon, according to various embodiments.

The BOX layer 416 may lie between a substrate 418 and the gap-fill 426, spacer 414, source/drain regions 430 and 431, and silicon-on-insulator ("SOT") 420, according to various embodiments.

A fill metal 412, which may form a gate, may surround the high-k dielectric layer 428. The fill metal 412 may be located above and below the stack of semiconductive channels at 410.

A dielectric layer 420 (e.g., SOT) may partially surround the fill metal 412, while touching 416 and above the SOT layer on the substrate 418.

A spacer 414 may be located between gap-fill 426, BOX layer 416 and SOT 420 according to various embodiments. The spacer 414 may be located between gap-fill at 426 and the stack of semiconductive channels at 410. The spacer 414 may be similar to the second spacer at 122 of FIG. 2A, according to various embodiments.

Semiconductive channels 410 may be located in the FET device 400. Semiconductive channels 410 (i.e., semiconductive layers) may be located between source/drain regions 430 and 431, and dielectric 428. The semiconductive channels 410 may be between about 8 nanometers (nm) and 250 nm wide (measured from lateral side to side), according to various embodiments. The semiconductive channels 410 may be between 3 nm and 15 nm tall, according to various embodiments.

High-k dielectric layers 428 may surround and separate (in the dimensions depicted) semiconductive channels 410 and fill metal 412. Sacrificial layers 432 may be located next to high-k dielectric layers in the view across gate of FIG. 4B, according to various embodiments. Dielectric layers may also surround fill metal 412 in the dimensions depicted in FIG. 4A, according to various embodiments. At 428, a high-k dielectric layer may surround the semiconductive channels, and the fill metal 412.

A gap-fill dielectric 426 may fill a space between BOX layer 416 and source/drain regions 430 and 431. The BOX layer may be formed to provide an etch stop layer for the dummy gate removal process. When poly-silicon is used as the dummy gate material, a layer may be needed to protect the fin stack channel during the dummy gate removal operation as there may be minimal etch contrast between the dummy gate and the semiconductive layers, according to various embodiments. A gap-fill 426 may be located surrounding the source/drain region(s), according to the dimensions depicted.

Figure 5:
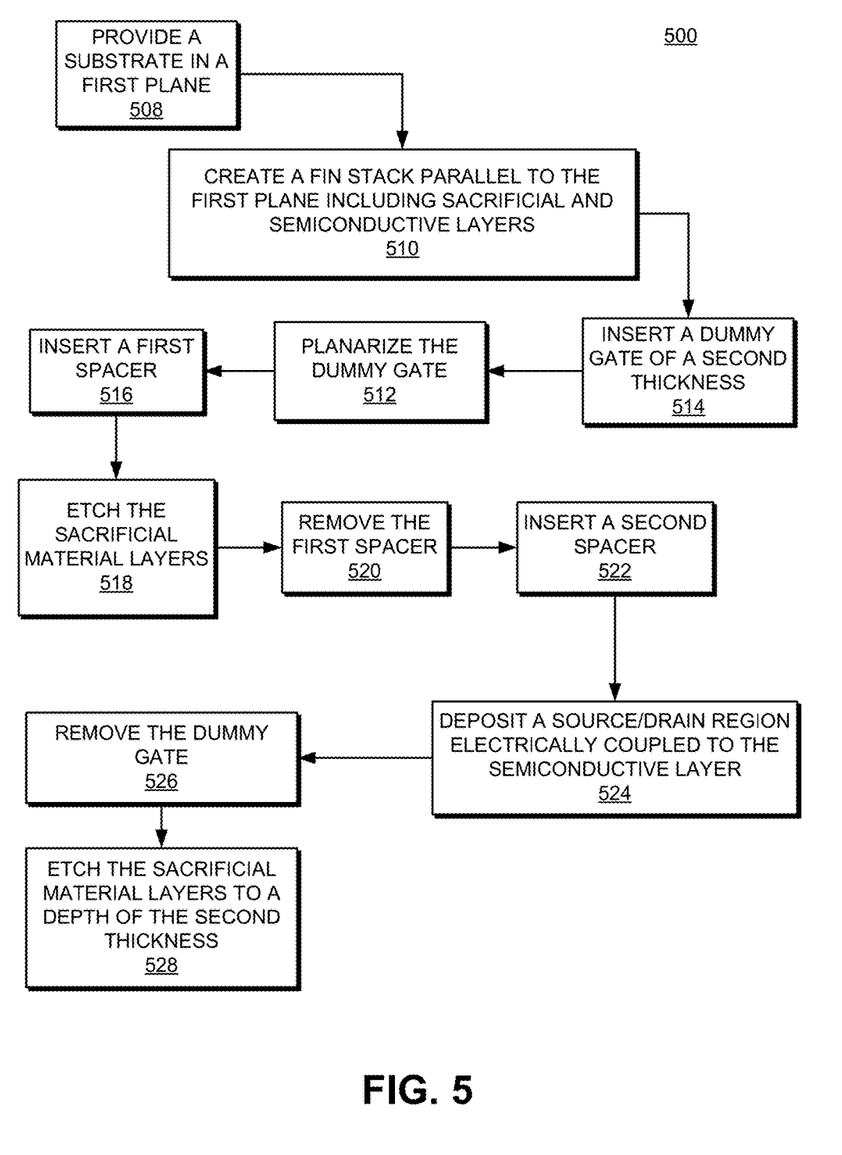
FIG. 5 illustrates a flowchart of a method of making a FET, according to various embodiments.

FIG. 5 illustrates a flowchart of a method 500 of making a FET, according to various embodiments. The method 500 may include a process flow with a plurality of operations. The operations may generally include creation and insertion of a substrate and a fin stack having sacrificial and semiconductive layers, insertion and removal of spacers and dummy gates, selective etching of sacrificial layers, deposition of high-k layer, and a replacement metal gate process.

At operation 508, the method 500 may start by forming a substrate material. A machine may cut the substrate material into a substrate, which may be provided in a first plane. The substrate may be a bulk silicon (Si) wafer or a Si layer with a silicon-on-insulator ("SOT") configuration, according to various embodiments. In the case of a SOT wafer substrate, the SOT wafer may include a Si substrate and a Si-containing SOT layer separated from the Si substrate by a buried oxide ("BOX") layer. The SOI layer may contain silicon germanium (SiGe). In various embodiments, in order to produce a SiGe SOI wafer, a semiconductive layer (composed of, e.g., SiGe, Si, SiC, GaAs, etc.) may be first epitaxially grown on the SOI layer. As described herein, the substrate may be provided in the first plane. The substrate may be cut or planarized to a thickness commensurate with the size of the components to be added, according to various embodiments. For example, the thickness of the substrate may be on the order of hundreds of microns.

At operation 510, a fin stack may be created. The fin stack may be inserted parallel to the first plane. The fin stack may include sacrificial (e.g., SiGe) and semiconductive (e.g., Si) layers. The fin stack may further contain an alternating series of semiconductive and sacrificial layers, which may be formed on the substrate, according to various embodiments. Specifically, a first sacrificial layer may be epitaxially grown on the substrate. The first sacrificial layer may be deposited on the substrate with a condensation method, according to various embodiments. The first sacrificial layer may be located above the substrate and the first sacrificial layer may be located in a second plane that is above and parallel to the first plane. The sacrificial layer may be formed from a sacrificial crystalline material which may be etched selectively to a semiconductive material at another operation.

A first semiconductive layer may be grown (e.g., by epitaxy) above the first sacrificial layer. The first semiconductive layer may be located above the first sacrificial material layer in a third plane, which may be parallel to the first plane. A second sacrificial material layer may be grown (e.g., by epitaxy) above the first semiconductive layer, and may be in a fourth plane, which may also be parallel to the first and third planes. One or more additional sacrificial layers or semiconductive layers may optionally be grown in an alternating fashion above the substrate, according to various embodiments. The properties of any additional sacrificial layers may be the same as the first sacrificial layer, and the properties of any additional semiconductive layers may be the same as the first semiconductive layer, according to various embodiments. A fourth plane may also be parallel to and above the third plane and may contain a second sacrificial layer.

At operation 512, a dummy gate of a second thickness may be inserted (see FIG. 1B, 116). A dummy gate oxide layer may be deposited on the dummy gate on the second face. The dummy gate may serve as a temporary placeholder for a replacement metal gate of a similar thickness, which may be inserted at another operation.

To form the dummy gate to be inserted, a dummy gate material may be first deposited onto the fin stack, on the top and lateral sides of the fin stack, e.g., by blanket deposition, according to various embodiments. According to various embodiments, the dummy gate material may be poly-silicon. The dummy gate may have a dummy gate void, which may occupy an area equivalent to the coplanar area of the fin stack with respect to the first spacer and the first void. The dummy gate may serve as a fin hardmask, according to various embodiments.

The patterning of the dummy gate may commensurate with an outline and location of the fins (lamellar channels), and likewise the dummy void, which may be used to form the source/drain and lamellar channel regions of the device in another operation.

The dummy gate may also have an outer end at the back side of the device that is coplanar to the second face of the fin stack.

Following deposition of the dummy gate material, the dummy gate material may be planarized at operation 514 (using, e.g., CMP) into the dummy gate. The dummy gate may be patterned to surround the exposed portions of the fins. The dummy gate may be planarized at a first face, according to various embodiments. Planarization may occur by, e.g., chemical-mechanical planarization ("CMP"). The fin stack may be planarized at a first face, wherein the first face is perpendicular to the first plane. The fin stack may also be planarized at a second face that is perpendicular to the first plane and parallel to the first face. The second face may align and be coplanar with a back end of the substrate, according to various embodiments.

At operation 516, a first spacer may be inserted. The first spacer may be inserted adjacent to and parallel to the dummy gate. The first spacer material may be formed on and around the last added (i.e., topmost if the substrate is on the bottom) layer of the fin stack, and may touch the substrate around the top end and lateral sides perpendicular to the front and back ends of the fin stack. The first spacer may be perpendicular to and above the substrate, which is located in the first plane.

The first spacer material may be deposited onto the fin stack, and may have a first thickness or be planarized to the first thickness. The deposited first spacer material may then be patterned into a first spacer. The first spacer may have a first void, which may occupy an area equivalent to the coplanar area of the fin stack with respect to the first spacer. The first spacer may have an outer end that is coplanar to the first face and located on the front side of the device. The first spacer may serve as a fin hardmask, according to various embodiments.

The patterning of the spacer may be commensurate with an outline and location of the fins (lamellar channels), which may be used to form the source/drain and lamellar channel regions of the device in another operation.

At operation 518, the sacrificial material layers may be selectively partially removed on the front side of the fin stack, for example by etching. The sacrificial layers may be selectively etched into fins. This process may be referred to as a fin etch. The sacrificial layers may be etched laterally (i.e., along the direction of the plane in which the layer is located) during the fin etch. Correspondingly, the first sacrificial material layer in the second plane and the second sacrificial material in the fourth plane may be etched. The sacrificial layers, following the fin etch, may be made to have a recessed depth compared to the semiconductive layers in the front-back direction. The relatively unaffected semiconductive layers, in contrast to the etched (i.e., partially removed) sacrificial layers, may form trenches between protruding lamellar channels in the fin stack. The trenches may form directly above, below and between the formed lamellar channels. For example, the sacrificial layers may be removed from the fin stack, resulting in a suspended lamellar channel formed from the exposed semiconductive layers. The lamellar channels may allow a separation between the sacrificial and semiconductive layers in order to allow for the formation of a replacement gate at another operation, according to various embodiments.

According to various embodiments, the first sacrificial material layer in the second plane and the second sacrificial layer in the fourth plane may be etched to a depth of the second thickness as measured from the second face to the third face, which may expose the first semiconductive layer.

At operation 520, the first spacer may be removed. The first spacer may be removed by various means. For example, the first spacer may be removed by using a chemical etching process, such as a selective aqueous (wet) etch, a high-temperature chemical vapor etch, a chemical downstream or potassium hydroxide (KOH) etch, or reactive-ion etching ("RIE") process. When the first spacer is removed, the fin stack and the oxide layer on the dummy gate may be exposed where the first spacer had been previously located, adjacent to the fin stack.

At operation 522, a second spacer may be inserted. The second spacer may be inserted in the location vacated by the removal of the first spacer at operation 520. The second spacer may be of the same (first) thickness of the first spacer. The second spacer may have a second void on the first face so that the second spacer exposes the semiconductive fins (i.e., exposed semiconductive layers). The second void may be of an area, shape or outline similar to the first void of the first spacer, except that the recessed sacrificial layers may be covered by the second spacer, only exposing the semiconductive fins (i.e., the lamellar channels). Stated otherwise, the second spacer may contain more material, cover a greater area and may have multiple, smaller sub-voids rather than one, larger void as the first spacer may have. The second spacer, once inserted, may entirely surround the exposed semiconductor fins as a result. The second spacer may serve as a fin hardmask, according to various embodiments.

At operation 524, a source/drain region may be deposited. The source/drain region may be electrically coupled to the semiconductive layers on the first face and touching the second spacer. The source/drain region may be deposited using a replacement metal gate process, according to various embodiments. The source/drain region may be a raised source/drain region, according to various embodiments.

Epitaxy may be used to form the source/drain region on the exposed portions of the layers. The epitaxy used to form the source/drain region may be carried out using vapor-phase epitaxy ("VPE"), molecular-beam epitaxy ("MBE") or liquid-phase epitaxy ("LPE") with a gaseous or liquid precursor, such as silicon tetrachloride. Further parameters and processes for using epitaxy to form raised source/drain regions are known to those of skill in the art and accordingly may not be described further herein. Another source/drain region may also be formed, according to various embodiments.

At operation 526, the dummy gate may be removed. The dummy gate may be removed using an aqueous (wet) etch process, a chemical etching process, such as chemical downstream or potassium hydroxide (KOH) etching, or reactive-ion etching ("RIE"), according to various embodiments. The dummy gate, when removed, may expose a third face on the oxide layer or the second spacer. The third face may be parallel to the first face.

Removal of the dummy gate may result in the fin stack being exposed on the second face.

At operation 528, the sacrificial layers at the second face may be etched to a depth of the second thickness, which may correspond to the depth of the removed dummy gate. The sacrificial layers on the back side of the device may be partially removed by a selective etch down to a depth of the third face The first sacrificial layer in the second plane and the second sacrificial layer in the fourth plane may be etched to add a depth of the second thickness as measured from the second face to the third face, exposing the semiconductive layers (i.e., the gate channels).

After the selective fin etch on the back side, gate channels formed from semiconductive fins may be exposed, including trenches formed between the gate channels. A trench may distinguish gate channel (semiconductive fin) regions of the device from sacrificial layer regions of the device, according to various embodiments.

A high-k dielectric layer may be advantageous compared to a standard dielectric, such as $SiO_2$. The high-k layer may be advantageous for various reasons, such as increased gate capacitance. The high-k layer may be deposited on the third face, according to various embodiments. Various examples of high-k materials include, but are not limited to, hafnium dioxide ($HfO_2$), zirconium dioxide ($ZrO_2$) and titanium dioxide ($TiO_2$) hafnium silicate ($HfSiO_4$), or zirconium silicate ($ZrSiO_4$). The high-k layer may be deposited, e.g., by ALD. The high-k dielectric may be beneficial because of increased gate capacitance without associated leakage effects. The high-k layer may surround the exposed semiconductive fins (i.e., the gate channels) except for the semiconductive fins' outer end, which may be endpointed at the second face, according to various embodiments.

A replacement metal gate may then be deposited on the high-k layer. The replacement metal gate may form a gate all-around (surrounding the lamellar channels) structure. The gate may be planar and may be located between the planes of the second face and the third face. The gate may be planarized at the second face, according to various embodiments. The replacement gate may be metal or other appropriate substances, as described herein, according to various embodiments.

As provided herein, more semiconductive and sacrificial layers than what are shown in various figures may be implemented in the same manner as described herein, except that in the initial stages of the process, additional semiconductive and sacrificial layers may be formed in the fin stack. In that case, a greater number gate channels would be formed in the appropriate operation.

The method as described above is used in the fabrication of integrated circuit chips.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of making a field-effect transistor device, comprising the steps of:
   forming a substrate, wherein the substrate is planarized to a thickness along a first plane;
   creating a fin stack parallel to the first plane, the fin stack having a plurality of fins, including:
      a first sacrificial material layer on the substrate,
      a first semiconductive material layer on the first sacrificial material layer, and
      a second sacrificial material layer on the first semiconductive material layer;
   inserting a dummy gate having a second thickness, a dummy void, and an outer end that is coplanar to a second face of the fin stack;
   inserting a first spacer having a first thickness and a first void, and having an outer end that is coplanar to a first face of the fin stack;
   removing, at least partially, the first sacrificial material layer and the second sacrificial material layer by etching the first sacrificial material layer in a second plane and the second sacrificial material layer in a fourth plane;
   removing the first spacer, following, removing, at least partially, the first sacrificial material layer;
   inserting a second spacer having the first thickness and a second void onto the first face such that the second spacer exposes and completely surrounds the first semiconductive material layer;
   removing the dummy gate, exposing a third face of the fin stack that is parallel to the first face; and
   depositing a high-k dielectric layer on the third face, wherein the high-k dielectric layer surrounds the exposed first semiconductive material layer, except for the outer of the exposed first semiconductive material layer.

2. The method of claim 1, further comprising:
   depositing a source/drain region electrically coupled to the first semiconductive material layer on the first face; and
   wherein the etching the first sacrificial material layer in the second plane and the second sacrificial material layer in the fourth plane is etched to a depth of the second thickness as measured from the second face to the third face.

3. The method of claim 1, wherein the etching the first sacrificial material in the second plane and the second sacrificial material layer in the fourth plane is etched to a depth of the first thickness as measured from the outer end of the first spacer.

4. The method of claim 1, wherein the substrate is a silicon-on-insulator ("SOI") wafer having an SOI layer separated from a silicon layer by a buried oxide layer.

5. The method of claim 1, wherein the semiconductive material is silicon.

6. The method of claim 1, wherein the sacrificial material is silicon germanium.

7. The method of claim 1, wherein the first and second spacers are silicon nitride.

8. The method of claim 1, wherein depositing the first sacrificial material layer on the substrate is accomplished using a condensation method.

9. The method of claim 1, wherein depositing the first semiconductive material layer on the first sacrificial material layer is accomplished using an epitaxial process.

10. The method of claim 1, wherein removing the dummy gate utilizes an aqueous etch process.

11. The method of claim 1, wherein inserting the dummy gate comprises the steps of:
    depositing a dummy gate material surrounding the plurality of fins;
    planarizing the dummy gate material;
    forming a fifth spacer on the dummy gate material that masks an outline and location of the dummy gates; and
    using a sixth spacer to pattern the dummy gates.

12. The method of claim 1, wherein the dummy gate comprises poly-silicon.

13. The method of claim 1, wherein the first plane is parallel to the second plane.

14. There method of claim 13, further comprising planarizing the fin stack at the first face that is perpendicular to the first plane and at the second face that is perpendicular to the first plane and parallel to the first face.

15. The method of claim 13, wherein providing the fin stack includes creating the fin stack, wherein the fin stack is parallel to the first plane, and wherein the creating the fin stack comprises the steps of:
    forming a third spacer on the stack that masks an outline and location of the plurality of fins; and
    using a fourth spacer to pattern the plurality of fins in the stack.

16. The method of claim 13, wherein the first sacrificial material layer on the substrate is located in the second plane.

17. The method of claim 16, wherein the first semiconductive material layer on the first sacrificial material layer is located in a third plane, wherein the third plane is parallel to the first plane.

18. The method of claim 17, wherein the second sacrificial material layer on the first semiconductive material layer is located in the fourth plane parallel to the first plane.

* * * * *